(12) United States Patent
Javorka et al.

(10) Patent No.: US 8,704,229 B2
(45) Date of Patent: Apr. 22, 2014

(54) PARTIAL POLY AMORPHIZATION FOR CHANNELING PREVENTION

(75) Inventors: Peter Javorka, Radeburg (DE); Glyn Braithwaite, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 129 days.

(21) Appl. No.: 13/190,566

(22) Filed: Jul. 26, 2011

(65) Prior Publication Data

US 2013/0026582 A1  Jan. 31, 2013

(51) Int. Cl.
   *H01L 29/04* (2006.01)
(52) U.S. Cl.
   USPC .......... 257/57; 257/52; 257/55; 257/61; 257/63; 257/204; 257/347; 257/413; 438/162; 438/199; 438/223; 438/230; 438/229; 438/275; 438/300; 438/301; 438/303; 438/305; 438/308; 438/311; 438/478; 438/486; 438/514; 438/520; 438/522; 438/528; 438/586
(58) Field of Classification Search
   USPC .......... 257/52, 55, 57, 61, 63, 204, 347, 413, 257/E21.054, E21.64, E21.133, E21.134, 257/E21.347, E21.211, E21.334–E21.336, 257/E21.409, E21.438, E21.444, E21.454, 257/E29.266, E21.545, E21.466, E21.561, 257/E21.564, E21.619, E21.632–E21.634, 257/E29.255; 438/162, 199, 223, 230, 229, 438/275, 300, 301, 303, 305, 308, 311, 478, 438/486, 514, 520, 522, 528, 535, 586, 482, 438/487, 634, 683, 649
   See application file for complete search history.

(56) References Cited

U.S. PATENT DOCUMENTS

| | | | | |
|---|---|---|---|---|
| 5,168,072 | A * | 12/1992 | Moslehi | 438/300 |
| 5,930,617 | A * | 7/1999 | Wu | 438/233 |
| 6,242,785 | B1 * | 6/2001 | Hossain et al. | 257/412 |
| 2009/0053865 | A1* | 2/2009 | Johnson et al. | 438/230 |

* cited by examiner

*Primary Examiner* — Jae Lee
*Assistant Examiner* — Junaiden Mirsalahuddin
(74) *Attorney, Agent, or Firm* — Ditthavong Mori & Steiner, P.C.

(57) ABSTRACT

Semiconductor devices are formed without zipper defects or channeling and through-implantation and with different silicide thicknesses in the gates and source/drain regions, Embodiments include forming a gate on a substrate, forming a nitride cap on the gate, forming a source/drain region in the substrate on each side of the gate, forming a wet cap fill layer on the source/drain region on each side of the gate, removing the nitride cap from the gate, and forming an amorphized layer in a top portion of the gate. Embodiments include forming the amorphized layer by implanting low energy ions.

17 Claims, 3 Drawing Sheets

PARTIAL POLY AMORPHIZATION FOR CHANNELING PREVENTION

TECHNICAL FIELD

The present disclosure relates to amorphization of semiconductor gates. The present disclosure is particularly applicable to semiconductor devices in 32 nanometer (nm) bulk and SOI, 22 nm bulk and SOI technology nodes, and beyond.

BACKGROUND

Currently, polycrystalline silicon having a thickness of 500 angstroms (Å) to 600 Å is being used for transistor gate electrodes. Since the gates are so thin, channeling and through-implantation during further implantation steps, for example, during halo/extension and source/drain regions implantation occur, further causing transistor leakage and lack of gate control. Although such through implantation may be blocked at the sides of the gate, the top of the gate remains vulnerable.

To reduce the channeling effect, a pre-amorphization implant (PAI) of the gate is employed. In standard gate amorphization, blanket PAI is performed after polycrystalline silicon deposition. This approach, as it is conducted prior to the gate etch, may lead to non-homogenous etching of the gate and may thus cause a bottle-shaped gate profile. Further, as the PAI is performed prior to halo/extension implantation, the amorphous extension regions re-crystallize after thermal anneal, which creates a so-called "zipper defect," thereby negatively affecting the transistor's performance and yield. Additionally, the amorphization implant may cause destruction/relaxation of embedded silicon germanium (eSiGe) source/drain regions, and, therefore, cannot be used for p-channel metal-oxide semiconductor (PMOS) transistors with eSiGe integration.

In addition, silicidation of gates and of source/drain regions are typically performed simultaneously such that the resulting silicides have the same thicknesses. However, for performance reasons it is beneficial for the gate silicide to extend closer to the gate dielectric, and for the silicide in the source/drain regions to be shallower. Current technology lacks sufficient control over the volume of silicide in the gates with respect to the volume of silicide in the source/drain regions.

A need therefore exists for methodology enabling amorphization of gates, after the gate etch, while protecting the surrounding areas and for independent silicidation of gates and source/drain regions, and the resulting devices.

SUMMARY

An aspect of the present disclosure is a method of fabricating a semiconductor device, by forming a wet gap fill layer prior to polycrystalline silicon amorphization, thereby protecting the gate's surrounding areas from implants during amorphization.

Another aspect of the present disclosure is a semiconductor device including a silicide layer in the gate having a greater thickness than the thickness of a silicide layer in the source/drain regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a gate on a substrate; forming a nitride cap on the gate; forming a source/drain region in the substrate on each side of the gate; forming a wet gap fill layer on the source/drain region on each side of the gate; removing the nitride cap from the gate; and forming an amorphized layer in a top portion of the gate.

Aspects of the present disclosure include forming the amorphized layer by implanting low energy ions in the gate. Further aspects include forming a liner on the nitride cap, on the sides of the gate, and on the source/drain region on each side of the gate, prior to forming the wet gap fill layer; and removing the liner from the nitride cap subsequent to forming the wet gap fill layer. Other aspects include removing the wet gap fill layer and the remaining liner, subsequent to implanting the low energy ions in the gate. Another aspect includes implanting germanium (Ge) or xenon (Xe) as the low energy ions. Further aspects include implanting Ge ions with an energy of 15 kiloelectron volts (keV) to 20 keV or Xe ions with an energy of 30 keV to 35 keV. Other aspects include implanting Ge or Xe ions in the upper ⅓ portion of the gate. Another aspect includes implanting Ge or Xe ions in the upper 100 Å to 200 Å of the gate. Further aspects include forming the wet gap fill layer of an organic planarizing layer (OPL) and forming the liner of an oxide. Other aspects include implanting a silicide promoter in the amorphized layer. Another aspect includes implanting a first silicide promoter in the gate prior to implanting Ge or Xe ions in the gate and a second silicide promoter in each source/drain region, the first silicide promoter having higher energy than the second silicide promoter. Further aspects include implanting a silicide promoter in the gate at a first energy; thermally diffusing the silicide promoter toward the substrate; and implanting each source/drain region with a silicide promoter at a second energy less than the first energy. Other aspects include forming halo/extensions regions in the substrate on each side of the gate subsequent to forming the amorphized layer.

Another aspect of the present disclosure is a device including: a substrate, a gate formed on the substrate, the gate including a polycrystalline silicon layer formed in the lower two thirds of the gate; a source/drain region in the substrate on each side of the gate; a first silicide formed in the upper one third of the gate; and a second silicide on each source/drain region, wherein the first silicide has a thickness greater than the second silicide.

Aspects include a device having a polycrystalline silicon layer with a thickness of 100 Å to 200 Å. Other aspects include a device wherein the thickness of the first silicide is 20% to 30% greater than the thickness of the second silicide.

Another aspect of the present disclosure is a method including: forming a polysilicon gate on a substrate; forming a nitride cap on the gate; forming an embedded silicon germanium (eSiGe) source/drain region in the substrate on each side of the gate; forming an oxide liner on the nitride cap on each side of the gate, and on each source/drain region; forming an organic planarizing wet gap fill layer on the oxide liner on each side of the gate to a thickness greater than a thickness of the gate; removing the oxide liner from the nitride cap; removing the nitride cap from the gate; implanting Ge ions with the energy of 15 keV to 20 keV or Xe ions with the energy of 30 keV to 35 keV in the upper ⅓ portion of the gate to amorphize the upper portion of the gate; removing the organic planarizing wet gap fill layer and remaining oxide liner; forming halo/extension regions in the substrate on each side of the gate; and forming a first silicide on the gate and a second silicide on each source/drain region, wherein the first silicide has a thickness greater than a thickness of the second silicide.

Aspects include forming the first silicide by implanting a silicide promoter in the amorphized portion of the gate. Further aspects include implanting a first silicide promoter in the gate prior to implanting the Ge or Xe ions in the gate and a second silicide promoter in each source/drain region, the first silicide promoter having a higher energy then the second silicide promoter. Another aspect includes implanting a silicide promoter in the gate at a first energy, thermally diffusing the silicide promoter toward the substrate, and implanting each source/drain region with a silicide promoter at a second energy less than the first energy.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
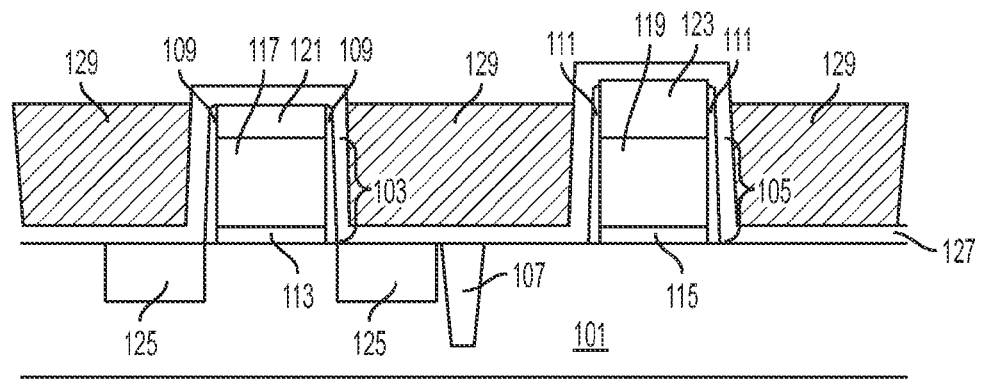
FIGS. 1A through 1F schematically illustrate a process flow for a semiconductor device, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of non-homogenous etching of the gate, formation of a zipper defect in extension regions, destruction/relaxation of eSiGe source/drain regions in PMOS transistors, and channeling and through-implantation during further implantation steps, attendant upon blanket PAI after polycrystalline silicon deposition for semiconductor gates. In accordance with embodiments of the present disclosure, the gates are etched prior to amorphization and a wet gap fill layer around the gates enables amorphization of only the gates, thereby avoiding the "zipper defect," destruction/relaxation of PMOS eSiGe source/drain regions, and non-homogenous etching of the gate, as well as channeling and through-implantation during further implantation steps. Amorphization of the top portion of the gate can be used to define the volume of the modified material in the gate that is different from the volume of the material in the source/drain regions, for example, to control the relative silicide thicknesses in the gate and in the source/drain regions.

Methodology in accordance with embodiments of the present disclosure includes forming a gate on a substrate, forming a nitride cap on the gate, forming a source/drain region in the substrate on each side of the gate, forming a wet gap fill layer on the source/drain region on each side of the gate, removing the nitride cap from the gate, and forming an amorphized layer in a top portion of the gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1F schematically illustrate a process flow for the amorphisation of polycrystalline silicon in a gate, and further, a formation in the gate of a silicide layer of a controlled thickness, in accordance with an exemplary embodiment. Adverting to FIG. 1A, gates 103 and 105, of a p-type and an n-type transistor, respectively, are formed by conventional methods on a substrate 101. Shallow trench isolation (STI) region 107 is formed in the substrate, to electrically isolate the p-type transistor from the n-type transistor. After gates 103 and 105 are etched, differential spacers 109 and 111 are formed on both sides of gates 103 and 105, respectively. Spacers may comprise nitride, for example silicon nitride (SiN), and are formed by conventional methods to a width of 30 Å to 200 Å.

Gates 103 and 105 may include gate dielectric layers 113 and 115, respectively, at the gate to substrate interface. Gate dielectric layers 113 and 115 may include an oxide, for example hafnium oxide. Gates 103 and 105 may further include polycrystalline silicon layers 117 and 119, respectively formed on dielectric layers 113 and 115, to a thickness of 500 Å to 600 Å. Nitride caps 121 and 123, for example of SiN, are formed on top of polycrystalline silicon layers 117 and 119, respectively. Source/drain regions 125, which may include eSiGe, are formed in the substrate on each side of gate 103, by conventional methods. A sacrificial liner 127 is formed on nitride caps 121 and 123, on each side of gates 103 and 105, and on source/drain regions 125. Liner 127 may be formed of an oxide, for example silicon oxide ($SiO_2$), and may be formed by thermal oxidation to the thickness of 10 Å to 50 Å. A wet gap fill layer 129 is formed on liner 127, on each side of gates 103 and 105, to a thickness that is greater than the thickness of polycrystalline silicone layers 117 and 119, for example, 400 Å to 600 Å. Wet gap fill layer 129 may be an organic planarizing layer, and may be formed by photosensitive organic polymer.

Figure 1B:
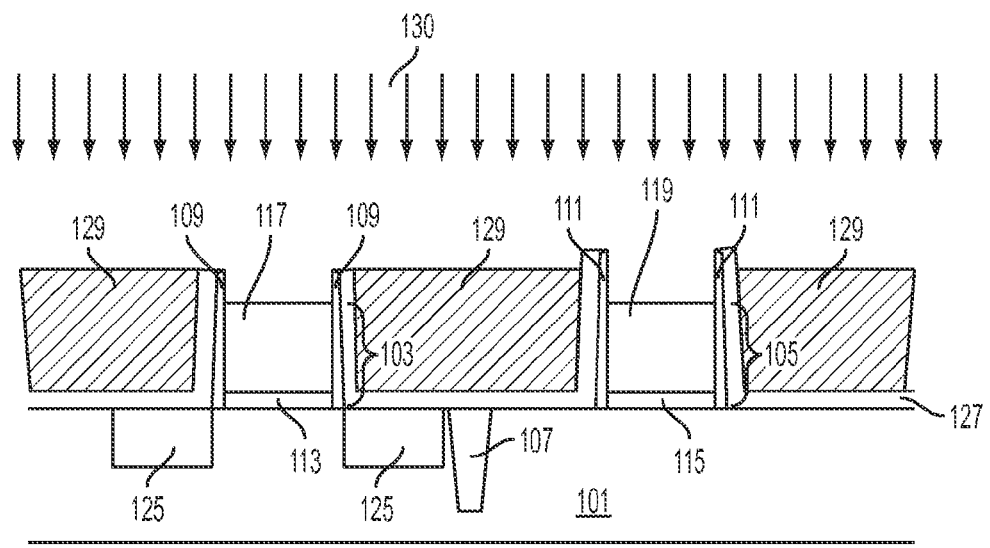

As illustrated in FIG. 1B, gates 103 and 105 are exposed by removal of liner 127 by, for example, polishing, e.g., chemical mechanical polishing (CMP), followed by removal of nitride caps 121 and 123, for example by etching, e.g., using hot phosphoric acid ($H_3PO_4$), or hydrofluoric acid (HF). Low energy ions 130 are implanted in gates 103 and 105 to amorphize the upper portion of polycrystalline silicon layers 117 and 119, respectively. Ions 130 may be, for example, germanium (Ge) or xenon (Xe). Ge implantation energy may be 15 keV to 20 keV, while Xe implantation energy may be 30 keV to 35 keV.

Figure 1C:
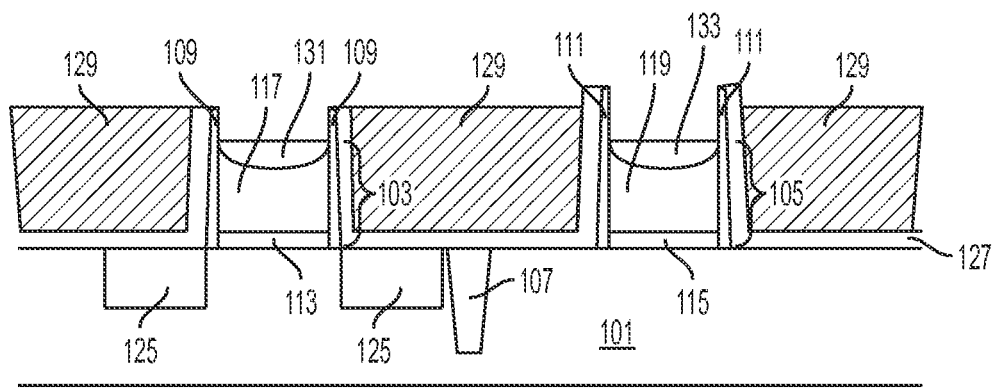

Adverting to FIG. 1C, amorphized layers 131 and 133 are illustrated, having a thickness that is one third the thickness of original polycrystalline silicon layers 117 and 119, respectively. The remaining polycrystalline silicon layers 135 and 137 have a thickness that is, for example, 300 Å to 500 Å, e.g., 400 Å.

Figure 1D:
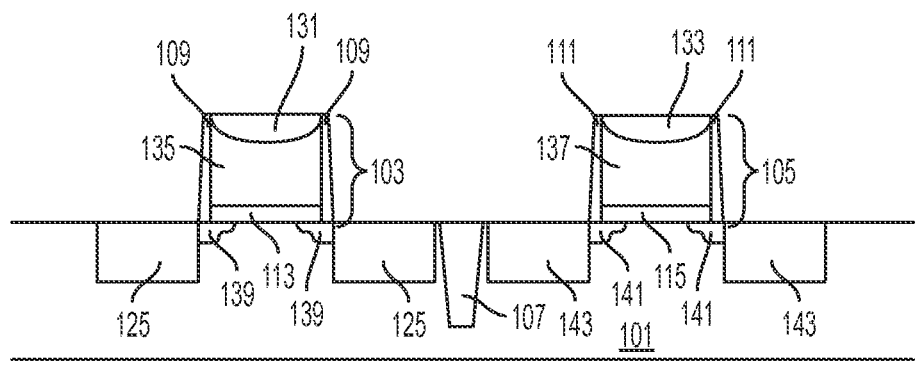

Wet gap fill layer 129 and remaining liner 127 are then removed, as illustrated in FIG. 1D. This may be performed by resist strip followed by HF etch. Halo/extension regions 139 and 141 may then be formed in substrate 101 on each side of gates 103 and 105, respectively, by arsenic (As) or boron (B) implantation. In addition, source/drain regions 143 may be formed on each side of gate 105, for example by implantation of As or B. Amorphized layers 131 and 133 prevent channeling and through-implantation during the halo/extension and source/drain implantations.

Figure 1E:
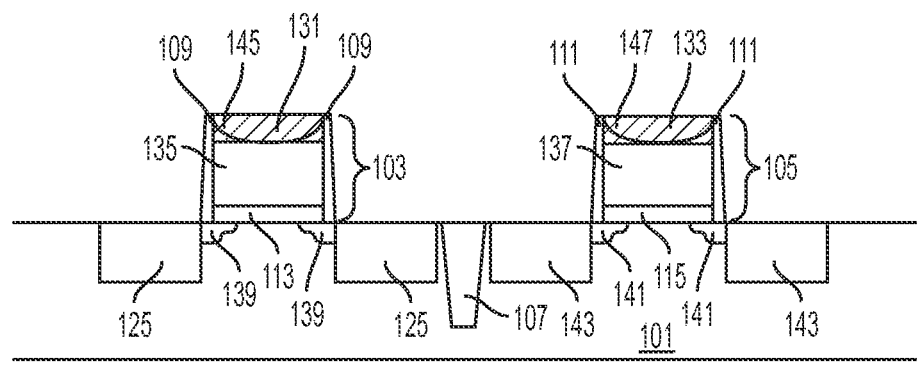

Amorphized layers 131 and 133 may also be used to control the volume of material in gates 103 and 105 that becomes silicided, to form a silicide in the gates to a different thickness than a silicide in the source/drain regions, as the gates benefit from a thicker silicide which extends closer to the dielectric layer, while it is beneficial for silicide in source/drain regions to be shallower, with less lateral spread under the gates. To accomplish silicidation, amorphized layers 131 and 133 may be implanted with a silicide promoter, for example selenium (Se) or sulfur (S), as illustrated in FIG. 1E, forming silicide promoter implanted layers 145 and 147. A silicide promoter may likewise be introduced into source/drain regions 125 and 143 (not shown for illustrative convenience). Alternatively, the silicide promoter may be implanted in gates 103 and 105 after gate etch and prior to implanting Ge or Xe ions in gates 103 and 105, with a higher energy than the silicide promoter implanted in source/drain regions 125 and 143. Gates 103 and 105 may, for example, be implanted with a silicide promoter with the energy of 10 keV to 50 keV, while source/drain regions 125 and 143 may be implanted with a silicide promoter with an energy of 2 keV to 20 keV. As another alternative, gates 103 and 105 may be implanted with a silicide promoter which is then thermally diffused (for example at temperatures of 600° C. to 800° C.) in the direction of substrate 101 until it reaches a required depth. Subsequent source/drain implants may then be at a lower energy, for example 2 keV to 10 keV.

Figure 1F:
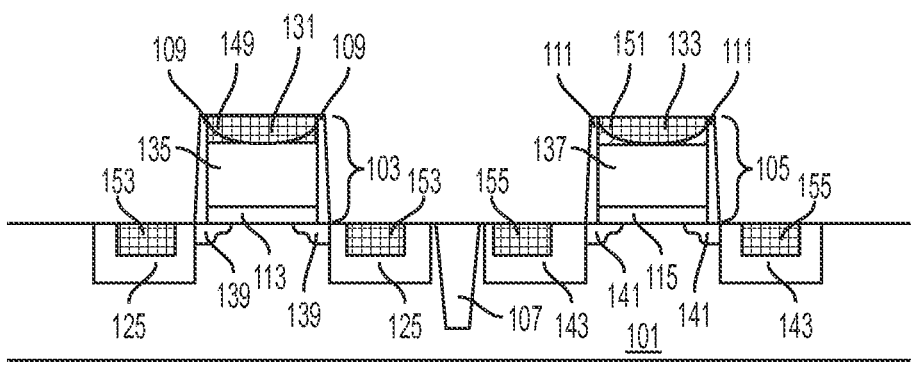

A metal layer, e.g., nickel or nickel alloy, is formed over gates 103 and 105 and source/drain regions 125 and 143 and is annealed to form the gate and source/drain silicides. FIG. 1F illustrates formation of gate silicides 149 and 151 in gates 103 and 105, respectively, and source/drain silicides 153 and 155 in source/drain regions 125 and 143, respectively. The thickness of gate silicides 149 and 151 is greater than the thickness of source/drain silicides, for example by 20% to 30%. Spacers 157 and 159 may be formed on both sides of gates 103 and 105, respectively, prior to silicide formation in source/drain regions 125 and 143.

The embodiments of the present disclosure can achieve several technical effects, including elimination of deformed bottle-shaped gates, prevention of the zipper defect in halo/extension regions, reduced destruction/relaxation of eSiGe source/drain regions in PMOS transistors, prevention of channeling and through-implantation during implantation of halo/extension regions and source/drain regions, thereby reducing transistor leakage and improving gate control, as well as independent control of the silicide volume in the gates and source/drain regions. The present disclosure enjoys industrial applicability in any of various types of highly integrated semiconductor technologies, particularly in 32 nm bulk, 32 nm SOI, 22 nm bulk, and 22 nm SOI technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate on a substrate;
   forming a nitride cap on the gate;
   forming a source/drain region in the substrate on each side of the gate subsequent to forming the nitride cap;
   forming a wet gap fill layer on the source/drain region on each side of the gate;
   removing the nitride cap from the gate subsequent to forming the wet fill layer; and
   forming an amorphized layer in a top portion of the gate subsequent to removing the nitride cap.

2. The method according to claim 1, comprising forming the amorphized layer by implanting low energy ions in the gate.

3. The method according to claim 2, further comprising:
   forming a liner on the nitride cap, on the sides of the gate, and on the source/drain region on each side of the gate, prior to forming the wet gap fill layer; and
   removing the liner from the nitride cap subsequent to forming the wet gap fill layer.

4. The method according to claim 3, further comprising:
   removing the wet gap fill layer and the remaining liner, subsequent to implanting the low energy ions in the gate.

5. The method according to claim 4, comprising implanting germanium (Ge) or xenon (Xe) as the low energy ions.

6. The method according to claim 5, comprising implanting Ge ions with an energy of 15 keV to 20 keV or Xe ions with an energy of 30keV to 35 keV.

7. The method according to claim 6, comprising implanting the Ge or Xe ions in an upper ⅓ portion of the gate.

8. The method according to claim 7, comprising implanting the Ge or Xe ions in an upper 1 Å to 200 Å of the gate.

9. The method according to claim 8, comprising:
   forming the wet gap fill layer of an organic planarizing layer (OPL); and
   forming the liner of an oxide.

10. The method of claim 7, further comprising implanting a silicide promoter in the amorphized layer.

11. The method according to claim 7, further comprising implanting a first silicide promoter in the gate prior to implanting the Ge or Xe ions in the gate and a second silicide promoter in each source/drain region, the first silicide promoter having a higher energy than the second silicide promoter.

12. The method according to claim 7, comprising:
   implanting a silicide promoter in the gate at a first energy;
   thermally diffusing the silicide promoter toward the substrate; and
   implanting each source/drain region with a silicide promoter at a second energy less than the first energy.

13. The method according to claim 1, comprising, forming halo/extension regions in the substrate on each side of the gate subsequent to forming the amorphized layer.

14. A method comprising:
forming a polysilicon gate on a substrate;
forming a nitride cap on the gate;
forming an embedded silicon germanium (eSiGe) source/drain region in the substrate on each side of the gate subsequent to forming the nitride cap;
forming an oxide liner on the nitride cap, on each side of the gate, and on each source/drain region;
forming an organic planarizing wet gap fill layer on the oxide liner on each side of the gate to a thickness greater than a thickness of the gate;
removing the oxide liner from the nitride cap subsequent to forming the organic planarizing wet gap fill layer;
removing the nitride cap from the gate subsequent to removing the oxide liner from the nitride cap;
implanting Ge ions with an energy of 15 key to 20 keV or Xe ions with an energy of 30 keV to 35 keV in an upper ⅓ portion of the gate to amorphize the upper portion of the gate subsequent to removing the nitride cap from the gate;
removing the organic planarizing wet gap fill layer and remaining oxide liner subsequent to implanting the Ge or Xe ions in the gate;
forming halo/extension regions in the substrate on each side of the gate subsequent to removing the organic planarizing wet gap fill layer; and
forming a first silicide on the gate and a second silicide on each source drain/region, wherein the first silicide has a thickness greater than a thickness of the second silicide.

15. The method according to claim 14, comprising forming the first silicide by implanting a silicide promoter in the amorphized portion of the gate.

16. The method according to claim 14, comprising implanting a first silicide promoter in the gate prior to implanting the Ge or Xe ions in the gate and a second silicide promoter in each source/drain region, the first silicide promoter having a higher energy then the second silicide promoter.

17. The method according to claim 14, comprising:
implanting a silicide promoter in the gate with a first energy;
thermally diffusing the silicide promoter toward the substrate; and
implanting a silicide promoter in each source/drain region with a second energy less than the first energy.

* * * * *